United States Patent
Kim et al.

(10) Patent No.: US 7,965,145 B2
(45) Date of Patent: Jun. 21, 2011

(54) VOLTAGE-CONTROLLED OSCILLATOR CIRCUIT INCLUDING LEVEL SHIFTER

(75) Inventors: Ji-hyun Kim, Gwacheon-si (KR); Jung-hyeon Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 57 days.

(21) Appl. No.: 12/460,129

(22) Filed: Jul. 14, 2009

(65) Prior Publication Data

US 2010/0013563 A1      Jan. 21, 2010

(30) Foreign Application Priority Data

Jul. 17, 2008   (KR) .................. 10-2008-0069739

(51) Int. Cl.
*H03B 27/01*     (2006.01)
(52) U.S. Cl. ........... 331/57; 331/16; 331/34; 331/177 R; 331/185
(58) Field of Classification Search .................... 331/57, 331/16, 34, 177 R, 185
See application file for complete search history.

(56) References Cited

U.S. PATENT DOCUMENTS

| 6,278,334 B1 | 8/2001 | Schorn |
| 6,985,040 B2 * | 1/2006 | Kim .............................. 331/16 |

FOREIGN PATENT DOCUMENTS

| JP | 9-223950 | 8/1997 |
| JP | 2005-184793 | 7/2005 |

* cited by examiner

*Primary Examiner* — Arnold Kinkead
(74) *Attorney, Agent, or Firm* — Mills & Onello LLP

(57) ABSTRACT

A voltage-controlled oscillator (VCO) circuit includes a level shifter, and a semiconductor device includes the VCO circuit. The VCO circuit includes an input voltage receiver, a current mirror, and a frequency oscillator. The input voltage receiver receives a first voltage input to the VCO circuit so as to generate a first current. The current mirror copies the first current so as to generate a second current. The frequency oscillator oscillates in response to the second current. The input voltage receiver includes a level shifter and a first current generator. The level shifter shifts a voltage level of the first voltage to a voltage level of a second voltage. The first current generator generates the first current corresponding to the second voltage.

13 Claims, 4 Drawing Sheets

VOLTAGE-CONTROLLED OSCILLATOR CIRCUIT INCLUDING LEVEL SHIFTER

CROSS-REFERENCE TO RELATED APPLICATIONS

This application claims the benefit of Korean Patent Application No. 10-2008-0069739, filed on Jul. 17, 2008, in the Korean Intellectual Property Office, the entire contents of which are incorporated herein by reference.

BACKGROUND

The inventive concept relates to a semiconductor device, and more particularly, to a voltage-controlled oscillator (VCO) circuit which may generate an output frequency with regard to even a low input voltage by performing a level shifting operation on the input voltage and may prevent a malfunction of a divider, which is caused by a high input voltage, and a semiconductor device including the VCO circuit.

When digital signals are transmitted using digital clocks, ranges for determining logic values 0 and 1 have to be accurately defined in advance in order to clearly determine whether an input signal has the value 0 or 1. That is, the start and end points of one clock have to be clearly determined. However, when signals are transmitted in a wired or wireless environment, a delay of a signal occurs according to a path of the signal such that a phase of the signal naturally changes. Thus, the start and end points for distinguishing between the values 0 and 1 by a reception terminal may become unclear.

As a result, a circuit for synchronizing the start and end points of a clock received by the reception terminal, with those of a clock transmitted by a transmission terminal, is required. A phase-locked loop (PLL) circuit functions to match a start (0°) and an end (360°) of a period of a clock. Regardless of how a signal is input, the PLL circuit functions to lock the signal as if the signal is input from a certain phase point.

Also, the PLL circuit is used in an analog circuit, such as a radio frequency (RF) circuit, as well as a digital circuit. In the analog circuit, the PLL circuit is used to prevent a frequency being used as a source from oscillating. A frequency generated by a VCO is largely influenced by its environment. Thus, in many cases, an output frequency is slightly oscillated and is modified into a frequency having a different range from that of the output frequency.

In this case, a system may not normally operate. Particularly, in a modern wireless communication system that has to finely divide and use frequencies, frequency stability is very important.

Furthermore, the PLL circuit functions to tune frequencies. In more detail, an output frequency may vary into a desired frequency by modifying a predetermined portion of the PLL circuit.

FIG. 1 is a schematic block diagram of a PLL circuit 100. FIG. 2 is a graph showing a correlation between an input voltage Vctrl and an output frequency Fout of a VCO 110 illustrated in FIG. 1. FIGS. 3A and 3B are graphs illustrating an operation of a divider 112 illustrated in FIG. 1.

Referring to FIG. 1, the PLL circuit 100 includes a temperature-compensated crystal oscillator (TCXO) 102, a phase detector (P/D) 104, a charge pump 106, a loop filter 108, the VCO 110, and the divider 112.

The TCXO 102 generates a reference frequency fref. The P/D 104 compares the reference frequency fref to a divided frequency fdiv output from the divider 112, outputs an up pulse signal UP if the reference frequency fref leads the divided frequency fdiv, and outputs a down pulse signal DN if the reference frequency fref lags behind the divided frequency fdiv. The charge pump 106 functions to convert the up pulse signal UP or the down pulse signal DN output from the P/D 104 into a voltage level. The loop filter 108 generally has a structure of a low-pass filter (LPF) and functions to accumulate and then emit charges from the charge pump 106 and to remove noise frequencies including undesired output components.

The VCO 110 outputs the output frequency Fout corresponding to the input voltage Vctrl. For example, if a voltage of 1.9V is input, a frequency of 790 megahertz (MHz) may be output, if a voltage of 2.0V is input, a frequency of 800 MHz may be output, and, if a voltage of 2.1V is input, a frequency of 810 MHz may be output. That is, the VCO 110 outputs the output frequency Fout corresponding to the input voltage Vctrl, as illustrated in FIG. 2.

The divider 112 functions to divide the output frequency Fout output from the VCO 110 based on a divide ratio, so as to output the divided frequency fdiv. If the divide ratio is 1/M, fdiv=Fout/M. The operation of the divider 112 may be represented as illustrated in FIGS. 3A and 3B. In more detail, the divider 112 converts a relatively high frequency, as illustrated in FIG. 3A, into a relatively low frequency, as illustrated in FIG. 3B.

A function of locking a frequency will now be described.

If a temperature changes and thus the output frequency Fout is not accurately output from the VCO 110, the P/D 104 compares a phase of the output frequency Fout to that of the reference frequency fref through a feedback. The P/D 104 outputs the up pulse signal UP if the reference frequency fref leads the fed-back divided frequency fdiv, and outputs the down pulse signal DN if the reference frequency fref lags behind the fed-back divided frequency fdiv. In this case, as a phase difference is large, a size of the up pulse signal UP or the down pulse signal DN is constant, however, a width of the up pulse signal UP or the down pulse signal DN varies in proportion to a size of the phase difference. Since the input voltage Vctrl of the VCO 110 has a predetermined voltage level, the up pulse signal UP or the down pulse signal DN which is output from the P/D 104 needs to be converted into the input voltage Vctrl of the VCO 110, by the charge pump 106.

However, if the reference frequency fref generated by the TCXO 102 is a high frequency, even a slight influence may vary the output frequency Fout. Thus, the phase difference needs to be compared to a low frequency that may be relatively easily compared. That is, the divider 112 provides the output frequency Fout of the VCO 110 by accurately reducing the output frequency Fout by a predetermined ratio.

By way of example, if the output frequency Fout of the VCO 110 is 800 MHz and the divider 112 uses a 1/100 divide ratio, a signal of 8 MHz is input to the P/D 104. Thus, the reference frequency fref of 8 MHz may be used. Since a TCXO is not significantly influenced by an external temperature so as to be able to stably output a frequency, the TCXO 102 generates the reference frequency fref.

The PLL circuit 100 may vary the output frequency Fout using the divider 112. If the divided frequency fdiv input to the P/D 104 is slightly modified, the output frequency Fout may be stable at another frequency.

For example, if the output frequency Fout of 800 MHz is generated using the reference frequency fref of 8 MHz, the divider 112 uses a 1/100 divide ratio. If the divider 112 uses a 1/99 divide ratio, the divided frequency fdiv is 8.08 MHz and the P/D 104 generates a pulse signal with a difference of 80 kilohertz (kHz).

If the above situation continues, the output frequency Fout that is ultimately output from the VCO 110 is locked to be 792 MHz, and the divided frequency fdiv that is output from the divider 112 using a 1/99 divide ratio is locked to be 792/99=8 MHz.

However, if the input voltage Vctrl is lower than a predetermined voltage level, the VCO according to a conventional approach may not operate. In more detail, the VCO 110 may not operate in an area which is indicated by "c" of FIG. 2 and where the input voltage Vctrl is lower than a threshold voltage Vth of a transistor that receives and uses the input voltage Vctrl as a gate voltage.

Also, as indicated by "a", "b", and "c" of FIG. 2, the VCO 110 according to the conventional art generates the output frequency Fout in proportion to the input voltage Vctrl regardless of the voltage level of the input voltage Vctrl, and thus, a voltage larger than a predetermined voltage level may be input so as to generate an excessively high frequency. In this case, the divider 112 may not perform a normal frequency dividing operation as illustrated in FIGS. 3A and 3B and a malfunction of the divider 112 may be caused due to a limitation of frequency speed.

SUMMARY

The inventive concept provides a voltage-controlled oscillator (VCO) circuit that may generate an output frequency with regard to even a low input voltage and may prevent a malfunction of a divider, which is caused by a high input voltage.

The inventive concept also provides a semiconductor device including a VCO circuit that may generate an output frequency with regard to even a low input voltage and may prevent a malfunction of a divider, which is caused by a high input voltage.

According to an aspect of the inventive concept, there is provided a voltage-controlled oscillator (VCO) circuit including an input voltage receiver which receives a first voltage input to the VCO circuit so as to generate a first current; a current mirror which copies the first current so as to generate a second current; and a frequency oscillator which oscillates in response to the second current, wherein the input voltage receiver includes a level shifter which shifts a voltage level of the first voltage to a voltage level of a second voltage; and a first current generator which generates the first current corresponding to the second voltage.

The level shifter may include a first input transistor which is turned on in response to the first voltage, and is a first type. In this case, the first input transistor may be a P-channel metal-oxide semiconductor (PMOS) transistor to which the first voltage is applied through a gate of the PMOS transistor.

The first current generator may include a second input transistor which is turned on in response to the second voltage which is a voltage of one end of the first input transistor, is connected to the current mirror, is a second type different from the first type, and has the same size as the first input transistor. In this case, the second input transistor may be an N-channel metal-oxide semiconductor (NMOS) transistor to which the second voltage is applied through a gate of the NMOS transistor.

The VCO circuit may further include a second voltage biasing unit which biases the second voltage to below a reference voltage level if the second voltage increases to above the reference voltage level. The frequency oscillator may include a plurality of inverters which invert in response to the second current and are connected to each other in series.

According to another aspect of the inventive concept, there is provided a voltage-controlled oscillator (VCO) circuit including an input voltage receiver which receives a first voltage input to the VCO circuit so as to generate a first current, wherein the input voltage receiver includes a first input transistor which is turned on in response to the first voltage, and is a first type; and a second input transistor which is turned on in response to the second voltage which is a voltage of one end of the first input transistor so as to generate the first current, is connected to the current mirror, is a second type different from the first type, and has the same size as the first input transistor. The VCO further includes a current mirror which copies the first current so as to generate a second current and a frequency oscillator which oscillates in response to the second current.

The first input transistor may be a P-channel metal-oxide semiconductor (PMOS) transistor to which the first voltage is applied through a gate of the PMOS transistor. In this case, the second input transistor may be an N-channel metal-oxide semiconductor (NMOS) transistor to which the second voltage is applied through a gate of the NMOS transistor.

The VCO circuit may further include a second voltage biasing unit which biases the second voltage to below a reference voltage level if the second voltage increases to above the reference voltage level. In this case, the second voltage biasing unit may include a transistor which is the first type and is connected to the current mirror in parallel, and of which one end is connected to the one end of the first input transistor.

The frequency oscillator comprises a plurality of inverters which invert in response to the second current and are connected to each other in series.

BRIEF DESCRIPTION OF THE DRAWINGS

The foregoing and other features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE EMBODIMENTS

Hereinafter, the inventive concept will be described in detail by describing embodiments of the inventive concept with reference to the attached drawings.

Figure 4:
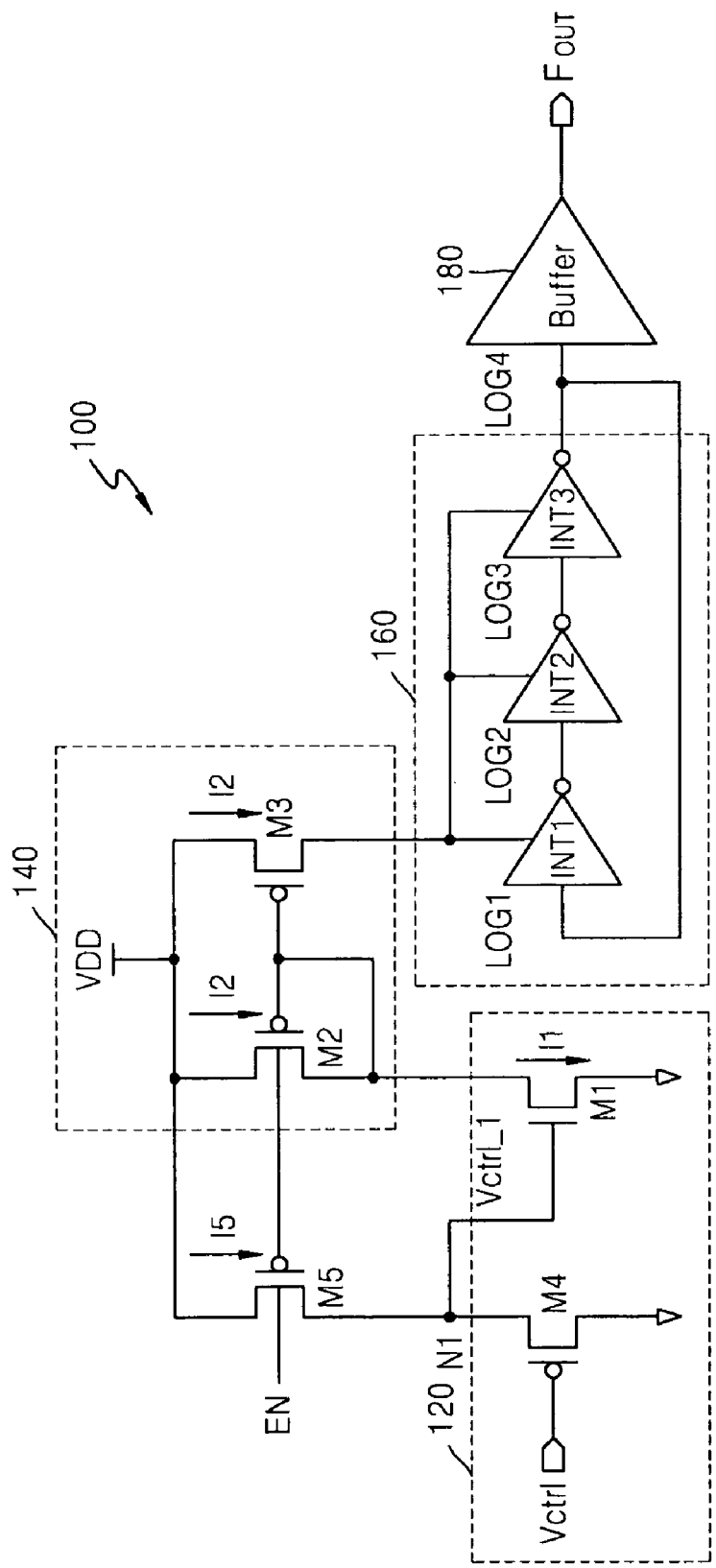
FIG. 4 is a circuit diagram of a VCO circuit according to an embodiment of the inventive concept.
Figure 5:
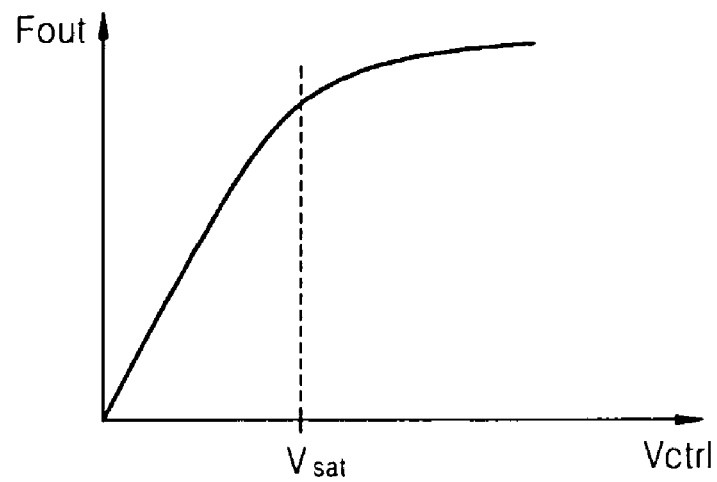
FIG. 5 is a graph illustrating a function of a second voltage biasing unit illustrated in FIG. 4.

FIG. 4 is a circuit diagram of a voltage-controlled oscillator (VCO) circuit 100 according to an embodiment of the inventive concept. FIG. 5 is a graph illustrating a function of a second voltage biasing unit M5 illustrated in FIG. 4.

Referring to FIG. 4, the VCO circuit 100 includes an input voltage receiver 120, a current mirror 140, and a frequency oscillator 160.

The input voltage receiver 120 receives a first voltage Vctrl input to the VCO circuit 100 so as to generate a first current I1. The current mirror 140 copies the first current I1 so as to generate a second current I2. The frequency oscillator 160 oscillates in response to the second current I2.

The input voltage receiver 120 may include a first input transistor M4 and a second input transistor M1. In this case, one end of the first input transistor M4 may be connected to a gate of the second input transistor M1 through a first node N1. Particularly, in FIG. 4, the first input transistor M4 is a P-channel metal-oxide semiconductor (PMOS) transistor and the second input transistor M1 is an N-channel metal-oxide semiconductor (NMOS) transistor.

An input voltage of the VCO circuit 100 is applied to a gate of the first input transistor M4. Hereinafter, for convenience of description, a voltage applied to the gate of the first input transistor M4 is referred to as the first voltage Vctrl and a voltage applied to the one end of the first input transistor M4 is referred to as a second voltage Vctrl_1.

The second voltage Vctrl_1 is applied to the gate of the second input transistor M1 as described above, and thus the second input transistor M1 is gated by the second voltage Vctrl_1 so as to generate the first current I1 corresponding to the second voltage Vctrl_1.

The other end of the first input transistor M4 is connected to a ground voltage and thus, the second voltage Vctrl_1 may be represented by Equation 1.

$$Vctrl\_1 = Vctrl - Vtm4 \quad (1)$$

Here, Vtm4 is a threshold voltage of the first input transistor M4. In this case, the first current I1 flowing through the second input transistor M1 may be represented by Equation 2.

$$I1 = \beta/2 * (Vctrl\_1 - Vtm1)^2 \quad (2)$$
$$= \beta/2 * ((Vctrl - Vtm4) - Vtm1)^2$$
$$= \beta/2 * (Vctrl - (Vtm1 + Vtm4))^2$$

Here, $\beta$ is $(1/2)*\mu o*Cox(W/L)$ and Vtm1 is a threshold voltage of the second input transistor M1. As described above, the first input transistor M4 is a PMOS transistor and the second input transistor M1 is an NMOS transistor, and thus, if both transistors have the same size, "Vtm1+Vtm4" of Equation 2 has a value 0.

Accordingly, although the input voltage of the VCO circuit 100 is lower than the threshold voltage Vtm1 of the second input transistor M1, the second input transistor M1 may generate the second current I2 corresponding to the input voltage.

The first current I1 generated by the second input transistor M1 as described above, ultimately activates the frequency oscillator 160 so that the VCO circuit 100 may output an output frequency Fout corresponding to the input voltage that is the first voltage Vctrl, which will now be described in detail.

The VCO circuit 100 according to the inventive concept shifts a voltage level of the input voltage using the first input transistor M4. Accordingly, the output frequency Fout may be generated even in an area that is indicated by "c" in FIG. 2 and where an input voltage is lower than a threshold voltage Vth. In more detail, according to the inventive concept, an output voltage with regard to even a low input voltage may be generated by performing a level shifting operation on the input voltage.

Regardless of a voltage level of the first voltage Vctrl, if the second input transistor M1 is turned on, the first current I1 is generated. The first current I1 is copied by the current mirror 140 that is connected to one end of the second input transistor M1, such that the second current I2, having the same size as the first current I1, is generated. The frequency oscillator 160 operates by the second current I2.

In FIG. 4, the frequency oscillator 160 includes first through third inverters INT1 through INT3 which invert in response to the second current I2 and are connected to each other in series. For example, if a logic level LOG 1 that is input to the first inverter INT1 is logic high H, a logic level LOG 2 that is logic low L is input to the second inverter INT2 is. Thus, the third inverter INT3 inverts a logic level LOG3 that is logic high H to output a logic level LOG4 that is logic low L. The logic level LOG4 output by the third inverter INT3 is used as the logic level LOG 1 input to the first inverter INT1.

That is, the frequency oscillator 160 oscillates in response to the first current I1 or the second current I2 corresponding to the input voltage that is the first voltage Vctrl, so as to generate the output frequency Fout corresponding to the input voltage.

The VCO circuit 100 according to the inventive concept may further include the second voltage biasing unit M5. If the second voltage Vctrl_1 increases to above a reference voltage level, the second voltage biasing unit M5 biases the second voltage Vctrl_1 to below the reference voltage level. In this case, the second voltage biasing unit M5 may be a PMOS transistor of which one end is connected to the one end of the first input transistor M4 and which is connected to the current mirror 140 in parallel. Hereinafter, for convenience of description, the PMOS transistor that is the second voltage biasing unit M5 is referred to as a biasing transistor M5.

The operation of the second voltage biasing unit M5 will now be described.

As shown in Equation 2, the first current I1 increases in proportion to the first voltage Vctrl or the second voltage Vctrl_1. In correspondence to the increased first current I1, the second current I2 and a current I5 flowing through the biasing transistor M5 also increase.

However, as shown in FIG. 5, if the first voltage Vctrl increases to above a predetermined voltage level Vsat, the second current I2 and the current I5 flowing through the biasing transistor M5 also increase, and thus, the second voltage Vctrl_1, a voltage of the first node N1, does not further increase.

Thus, according to the inventive concept, a high input voltage above a predetermined voltage level may be biased to below the predetermined voltage level such that a malfunction of a divider, which is caused by the high input voltage, may be prevented.

Figure 6:
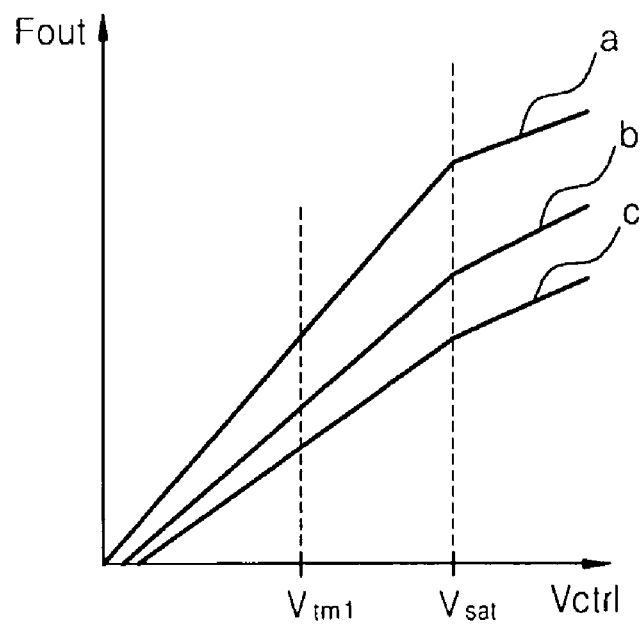
FIG. 6 is a graph showing a correlation between an input voltage and an output frequency of the VCO circuit illustrated in FIG. 4.

FIG. 6 is a graph showing a correlation between an input voltage Vctrl and an output frequency Fout of the VCO circuit 100 illustrated in FIG. 4.

Figure 1:
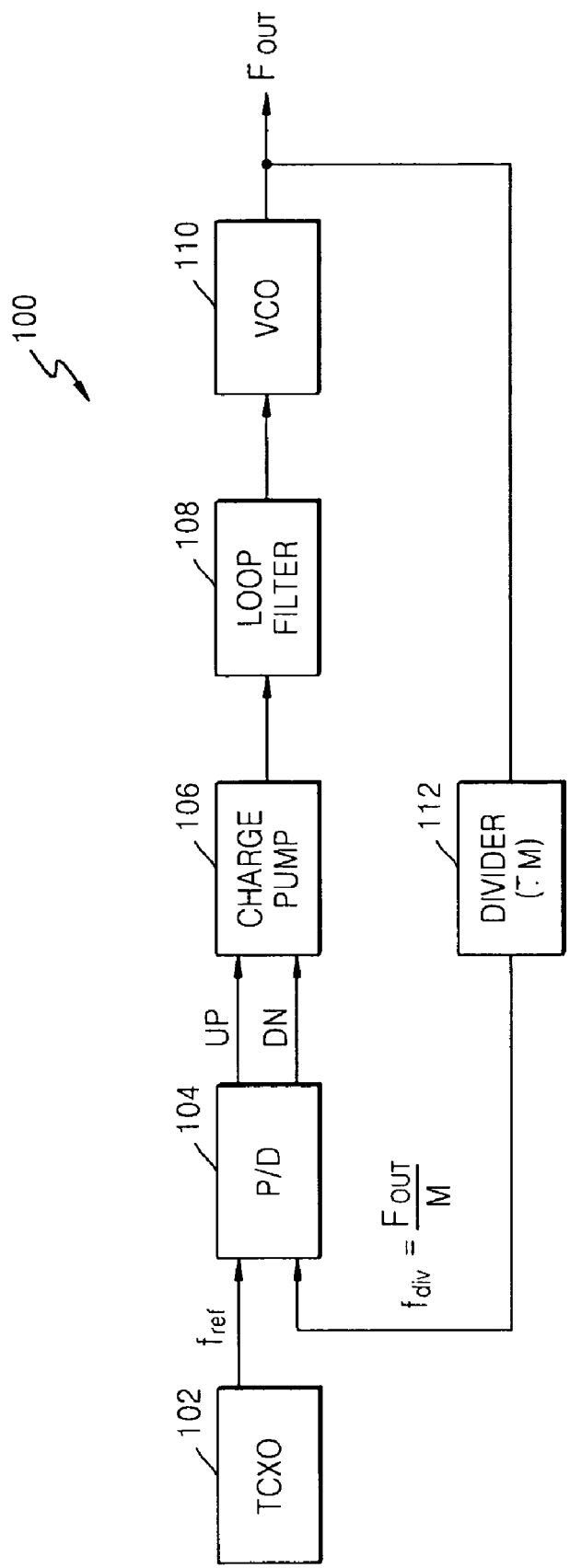
FIG. 1 is a schematic block diagram of a phase-locked loop (PLL) circuit.
Figure 2:
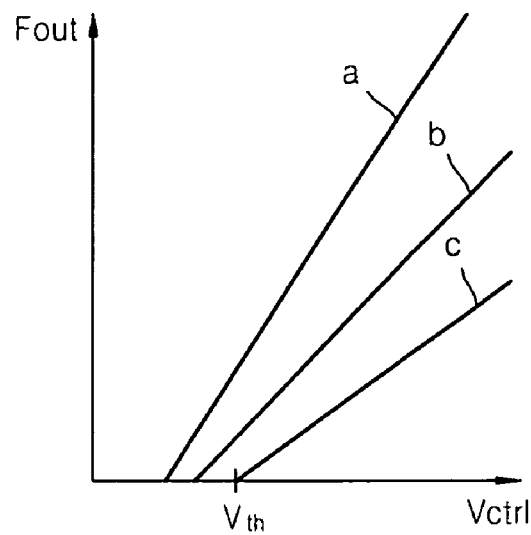
FIG. 2 is a graph showing a correlation between an input voltage and an output frequency of a voltage-controlled oscillator (VCO) illustrated in FIG. 1.
Figure 3A:
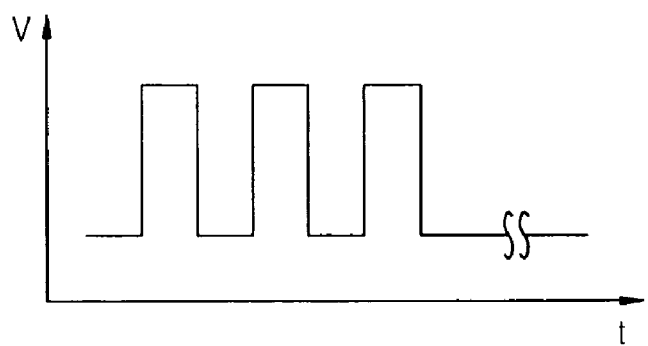
FIGS. 3A and 3B are graphs illustrating operation of a frequency divider illustrated in FIG. 1.
Figure 3B:
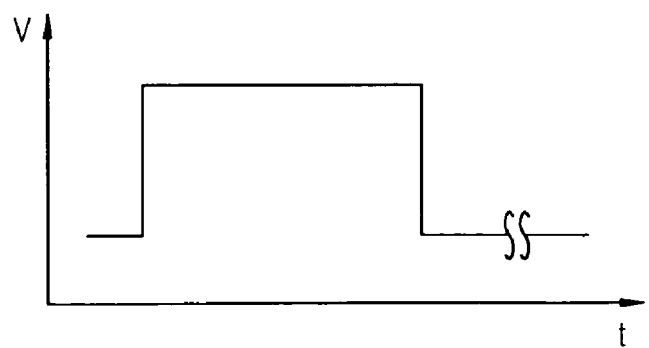

Referring to FIG. 6, unlike the related art shown in FIG. 2, the VCO circuit 100 according to the inventive concept may generate the output frequency Fout with regard to even a low input voltage. Also, if the input voltage Vctrl is above a predetermined voltage level Vsat, the VCO circuit 100 according to the inventive concept may bias the input voltage Vctrl to below a reference voltage level so as to prevent a malfunction of a divider, which is caused by a high input voltage.

While the inventive concept has been particularly shown and described with reference to exemplary embodiments thereof, terms used herein to describe the inventive concept are for descriptive purposes only and are not intended to limit the scope of the inventive concept.

Accordingly, it will be understood by one skilled in the art that various changes in form and details may be made therein without departing from the spirit and scope of the following claims.

What is claimed is:

1. A voltage-controlled oscillator (VCO) circuit comprising:
    an input voltage receiver which receives a first voltage input to the VCO circuit so as to generate a first current;
    a current mirror which copies the first current so as to generate a second current;
    a frequency oscillator which oscillates in response to the second current,
    wherein the input voltage receiver comprises:
        a level shifter which shifts a voltage level of the first voltage to a voltage level of a second voltage; and
        a first current generator which generates the first current corresponding to the second voltage; and
    a second voltage biasing unit which biases the second voltage to below a reference voltage level if the second voltage increases to above the reference voltage level.

2. The VCO circuit of claim 1, wherein the level shifter comprises a first input transistor which is turned on in response to the first voltage, and is a first type.

3. The VCO circuit of claim 2, wherein the first input transistor is a P-channel metal-oxide semiconductor (PMOS) transistor to which the first voltage is applied through a gate of the PMOS transistor.

4. The VCO circuit of claim 2, wherein the first current generator comprises a second input transistor which is turned on in response to the second voltage which is a voltage of one end of the first input transistor, is connected to the current mirror, is a second type different from the first type, and has the same size as the first input transistor.

5. The VCO circuit of claim 3, wherein the second input transistor is an N-channel metal-oxide semiconductor (NMOS) transistor to which the second voltage is applied through a gate of the NMOS transistor.

6. The VCO circuit of claim 1, wherein the frequency oscillator comprises a plurality of inverters which invert in response to the second current and are connected to each other in series.

7. A phase-locked loop (PLL) device comprising the VCO circuit of claim 1.

8. A voltage-controlled oscillator (VCO) circuit comprising:
    an input voltage receiver which receives a first voltage input to the VCO circuit so as to generate a first current;
    a current mirror which copies the first current so as to generate a second current;
    a frequency oscillator which oscillates in response to the second current,
    wherein the input voltage receiver comprises:
        a first input transistor which is turned on in response to the first voltage, and is a first type; and
        a second input transistor which is turned on in response to the second voltage which is a voltage of one end of the first input transistor so as to generate the first current, is connected to the current minor, is a second type different from the first type, and has the same size as the first input transistor; and
    a second voltage biasing unit which biases the second voltage to below a reference voltage level if the second voltage increases to above the reference voltage level.

9. The VCO circuit of claim 8, wherein the first input transistor is a P-channel metal-oxide semiconductor (PMOS) transistor to which the first voltage is applied through a gate of the PMOS transistor.

10. The VCO circuit of claim 9, wherein the second input transistor is an N-channel metal-oxide semiconductor (NMOS) transistor to which the second voltage is applied through a gate of the NMOS transistor.

11. The VCO circuit of claim 8, wherein the second voltage biasing unit comprises a transistor which is the first type and is connected to the current mirror in parallel, and of which one end is connected to the one end of the first input transistor.

12. The VCO circuit of claim 8, wherein the frequency oscillator comprises a plurality of inverters which invert in response to the second current and are connected to each other in series.

13. A phase-locked loop (PLL) device comprising the VCO circuit of claim 8.

* * * * *